United States Patent
Nguyen (10) Patent No.: US 10,168,191 B2
(45) Date of Patent: *Jan. 1, 2019

(54) METHODS FOR FABRICATING APPARATUS HAVING A HERMETIC SEAL

(71) Applicant: DunAn Sensing LLC, San Jose, CA (US)

(72) Inventor: Tom T. Nguyen, San Jose, CA (US)

(73) Assignee: DUNAN SENSING LLC, San Jose, CA (US)

(*) Notice: Subject to any disclaimer, the term of this patent is extended or adjusted under 35 U.S.C. 154(b) by 287 days.

This patent is subject to a terminal disclaimer.

(21) Appl. No.: 14/821,459

(22) Filed: Aug. 7, 2015

(65) Prior Publication Data

US 2015/0343575 A1 Dec. 3, 2015

Related U.S. Application Data

(63) Continuation of application No. 14/170,355, filed on Jan. 31, 2014, now Pat. No. 9,581,468.

(51) Int. Cl.
*G01D 11/24* (2006.01)
*B81C 3/00* (2006.01)
(Continued)

(52) U.S. Cl.
CPC .......... *G01D 11/245* (2013.01); *B23P 11/005* (2013.01); *B81C 1/00325* (2013.01); *B81C 3/008* (2013.01); *G01D 11/26* (2013.01); *G01L 5/165* (2013.01); *G01L 19/0672* (2013.01); *G01L 19/14* (2013.01); *G01L 19/145* (2013.01); *H01L 23/10* (2013.01); *B81B 7/0032* (2013.01); *B81B 2201/0264* (2013.01); *B81C 1/00261* (2013.01); *B81C 3/00* (2013.01);
(Continued)

(58) Field of Classification Search
CPC ... B81B 7/0032; B81B 7/0035; B81B 7/0041; B81B 7/0077; B81B 2201/0264; B81C 1/00047; B81C 1/00261; B81C 1/00277; B81C 1/00293; B81C 1/00325; B81C 3/001; B81C 3/005; B81C 3/008; B81C 2203/054; B81C 2203/0172; B81C 2203/019; B81C 1/00333; B81C 3/00; G01D 11/24; G01D 11/245; G01L 19/14; G01L 19/142; G01L 19/143; G01L 19/144; G01L 19/145; G01L 19/147; G12B 9/04; G12B 9/06; H01L 23/02
See application file for complete search history.

(56) References Cited

U.S. PATENT DOCUMENTS

3,294,895 A * 12/1966 Reintgen ................. H01L 21/48
174/525
4,833,922 A * 5/1989 Frick .................... G01L 19/0038
73/706
(Continued)

*Primary Examiner* — Matthew P Travers
(74) *Attorney, Agent, or Firm* — Hackler Daghighian Martino & Novak (57) ABSTRACT

Apparatus and Methods for fabricating apparatus having a hermetic seal to seal a portion of an apparatus, for example and without limitation, a portion having a MEMS sensor. One such method uses crimping devices to compress a seal in a cavity formed in a housing that includes a MEMS sensor attached to a stress isolator. Under such compression, the seal deforms to hermetically seal surfaces around the inside, outside and bottom of the stress isolator.

21 Claims, 10 Drawing Sheets

(51) Int. Cl.
  *B81C 1/00* (2006.01)
  *H01L 23/10* (2006.01)
  *G01L 19/14* (2006.01)
  *G01L 19/06* (2006.01)
  *B23P 11/00* (2006.01)
  *G12B 9/06* (2006.01)
  *B81B 7/00* (2006.01)
  *G01L 5/16* (2006.01)
  *G01D 11/26* (2006.01)

(52) U.S. Cl.
  CPC .......... *B81C 2203/019* (2013.01); *G12B 9/06* (2013.01); *Y10T 29/49872* (2015.01); *Y10T 29/49874* (2015.01); *Y10T 29/49913* (2015.01); *Y10T 29/49915* (2015.01)

(56) References Cited

U.S. PATENT DOCUMENTS

| | | | | |
|---|---|---|---|---|
| 4,888,662 A * | 12/1989 | Bishop | G01L 9/0075 | 361/283.1 |
| 4,903,164 A * | 2/1990 | Bishop | G01L 9/0075 | 29/25.42 |
| 4,993,267 A * | 2/1991 | Allard | G01L 9/0051 | 338/4 |
| 5,939,637 A * | 8/1999 | Pitzer | G01L 19/142 | 73/715 |
| 6,209,399 B1 * | 4/2001 | Probst | G01L 19/0084 | 73/756 |
| 6,619,129 B2 * | 9/2003 | Pitzer | G01L 19/003 | 73/700 |
| 6,725,514 B2 * | 4/2004 | Moyer | G01K 7/183 | 29/25.35 |
| 8,051,719 B2 * | 11/2011 | Bigliati | G01L 9/0052 | 73/756 |
| 8,408,067 B2 * | 4/2013 | Zorzetto | G01L 9/0051 | 73/756 |
| 8,643,127 B2 * | 2/2014 | Dangtran | B81B 7/0077 | 257/415 |
| 9,671,256 B2 * | 6/2017 | Suma | G01D 11/245 | |
| 2003/0154795 A1 * | 8/2003 | Pitzer | G01L 19/003 | 73/715 |
| 2005/0061080 A1 * | 3/2005 | Sasaki | G01D 11/245 | 73/754 |
| 2006/0162461 A1 * | 7/2006 | Amore | G01L 9/0075 | 73/724 |
| 2008/0099861 A1 * | 5/2008 | Dangtran | G01D 11/245 | 257/415 |
| 2008/0236290 A1 * | 10/2008 | Iimori | G01L 19/0061 | 73/715 |
| 2009/0049921 A1 * | 2/2009 | Otsuka | G01L 19/0069 | 73/706 |
| 2010/0011871 A1 * | 1/2010 | Bigliati | G01L 9/0052 | 73/756 |
| 2013/0000413 A1 * | 1/2013 | Mitchell | G01L 19/143 | 73/756 |
| 2013/0031984 A1 * | 2/2013 | Jones | G01L 19/143 | 73/717 |
| 2013/0047736 A1 * | 2/2013 | Papadeas | G01L 19/0038 | 73/714 |
| 2013/0192361 A1 * | 8/2013 | Herderich | G01D 11/245 | 73/431 |
| 2014/0260649 A1 * | 9/2014 | Petrucelli | G01L 9/0055 | 73/726 |
| 2015/0330858 A1 * | 11/2015 | Sato | G01L 19/147 | 73/754 |
| 2015/0346045 A1 * | 12/2015 | Habibi | G01L 9/0052 | 73/754 |
| 2016/0305839 A1 * | 10/2016 | Becher | G01L 19/142 | |
| 2017/0299453 A1 * | 10/2017 | Kobayashi | G01L 9/0041 | |

* cited by examiner

FIG. 1A

Radial Seal   Face Seal   Complete Seal

METHODS FOR FABRICATING APPARATUS HAVING A HERMETIC SEAL

RELATED APPLICATIONS

This application is a continuation of co-pending application Ser. No. 14/170,355 filed Jan. 31, 2014, and claims the benefit thereof.

TECHNICAL FIELD

One or more embodiments relate to apparatus having a hermetic or airtight seal, and one or more further embodiments relate to methods of fabricating such apparatus.

BACKGROUND

Many conventional methods exist for forming seals which prevent leakage of liquid, gas, and the like from one section of a package to another. For example, conventional methods for forming seals entail: (a) using O-rings; (b) welding; (c) soldering; and (d) gluing. Many such conventional methods are acceptable in environments where sealing is not very sensitive or important. However, in many environments, including those where sensors are placed along different sections of a package to measure pressure, obtaining an airtight or hermetic seal is important and conventional methods are not adequate.

In typical conventional pressure sensor devices, a convoluted, thin, metal diaphragm is welded in a pressure path to seal (so as to reduce leakage of gas from) a gas-filled chamber. In manufacturing other types of conventional pressure sensor devices, a metal housing is fabricated using stainless steel alloys (due to their anti-corrosion characteristics). In such cases, a sealing method typically entails the use of a laser beam or an electron beam ("e-beam") to melt the metal to form a hermetic seal.

A MEMS ("Micro-Electro-Mechanical Systems") pressure sensor device uses a silicon base which is mounted on a metal, for example, Kovar or Invar, whose coefficient of thermal expansion closely matches that of the silicon base (in general, stainless steel alloys cannot be used). Due to continuing requirements for low cost pressure sensor devices, it is desirable that a metallic housing for such devices be made from materials such as brass, copper and aluminum, and not stainless steel. However, joining thermally matched metal (for example, Kovar or Invar) to a metallic housing (made, for example, of thermally mismatched metals such as brass, copper or aluminum) using a conventional laser welding method typically results in weld cracks. In other words, conventional laser welding methods used with these metals have been unsuccessful in forming hermetic seals. Further, alternate sealing methods such as brazing and soldering require processes at temperatures above 800° C., which high temperatures are unacceptable for use in fabricating MEMS sensor devices.

SUMMARY

One or more embodiments relate to apparatus having a hermetic seal such as, for example and without limitation, pressure sensor devices that include MEMS sensors. One or more further embodiments relate to methods for fabricating such apparatus such as, for example and without limitation, methods for fabricating pressure sensor devices that include MEMS sensors without damaging such sensors. In particular, one or more further embodiments of methods for fabricating entail the use different types of metal seals to seal portions of an apparatus so that MEMS sensors can be used. In further particular, one or more such further embodiments of methods for fabricating entail the use of crimping devices to pressure seal metal seals within the apparatus. In still further particular, one or more such further embodiments of methods for fabricating provide hermetic sealing by compression forces at a leak rate equal to welding methods, and which do not cause leakage.

DETAILED DESCRIPTION OF THE PREFERRED EMBODIMENTS

Embodiments will be described with reference to the figures, wherein like components, parts, and so forth are designated by like reference numerals throughout the various figures. Further, specific parameters such as pressure values, materials, size, dimensions, shapes, and the like are provided herein, and are intended to be explanatory rather than limiting.

One or more process embodiments are directed to methods for forming a hermetic seal to seal a portion of an apparatus (such as, for example and without limitation, a pressure sensor apparatus or device), and in particular, a portion such as, for example and without limitation, a portion having a MEMS ("Micro-Electro-Mechanical Systems") sensor. In accordance with one or more such process embodiments, the methods entail forming a hermetic seal by deforming a seal in a cavity formed in a housing that includes a MEMS sensor attached to a stress isolator. In accordance with one or more such process embodiments, the seal can be made of metal, which metal is preferably a soft metal such as, for example and without limitation, copper or copper alloy. However, one or more further process embodiments include the use of other metals or non-metals capable of forming a hermetic seal. It is believed that one or more of the process embodiments act provide an airtight or hermetic seal by using mechanical pressure to "melt" or "soft anneal" a metal seal (i.e., to form a "solder-like" seal which is airtight or hermetic).

In addition, one or more apparatus embodiments are directed to apparatus having a hermetic seal that seals a portion of the apparatus, and in particular, a portion such as, for example and without limitation, a portion having a MEMS sensor.

Figure 1A:
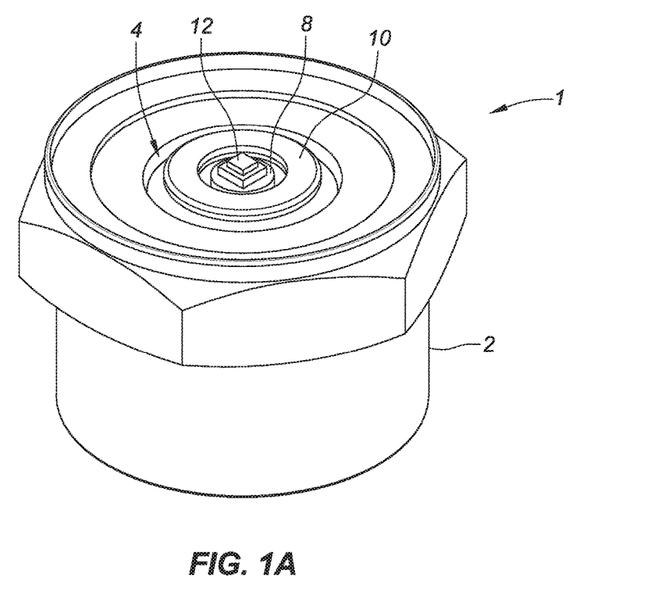
FIG. 1A is a perspective view of an apparatus having a hermetic seal that is fabricated in accordance with one or more embodiments.

FIG. 1A is a perspective view of apparatus 1 which has a hermetic seal and which is fabricated in accordance with one or more process embodiments. As shown in FIG. 1A, apparatus 1 includes: housing 2 having cavity 4 therein, stress isolator 8 with attached MEMS sensor 12, and collar 10. MEMS sensor 12 is typically used to sense and measure the pressure of a fluid or liquid. Not shown in FIG. 1A is a hermetic seal disposed between stress isolator 8 and an inner wall of cavity 4.

Figure 1B:
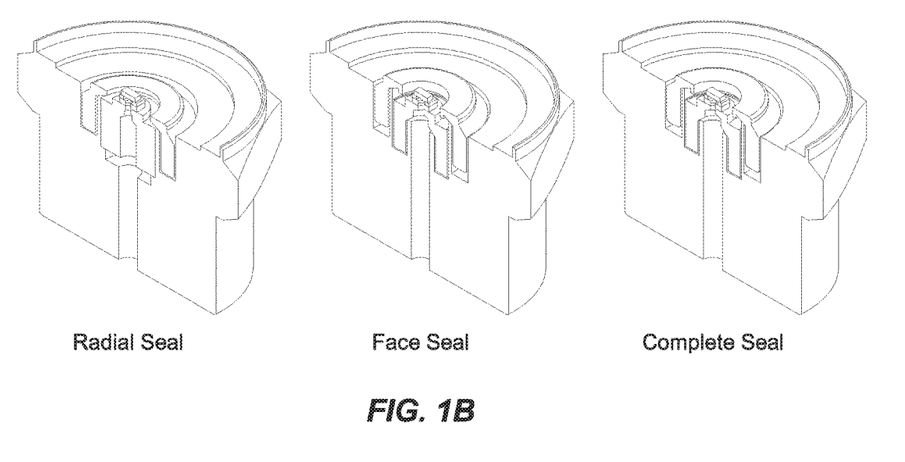
FIG. 1B shows cross sectional views of three apparatus embodiments of the apparatus shown in FIG. 1A a first apparatus embodiment that is fabricated in accordance with a first process embodiment that uses a radial seal, a second apparatus embodiment that is fabricated in accordance with a second process embodiment that uses a "complete" seal, and a third apparatus embodiment that is fabricated in accordance with a third process embodiment that uses a "face" seal.

FIG. 1B shows cross sectional views of three apparatus embodiments of apparatus 1 shown in FIG. 1A. The first apparatus embodiment shown in FIG. 1B is fabricated in accordance with a first process embodiment that uses a radial seal, and is described below with reference to FIGS. 2-7; the second apparatus embodiment shown in FIG. 1B is fabricated in accordance with a second process embodiment that uses a "complete" seal, and is described below with reference to FIGS. 8-13; and the third apparatus embodiment shown in FIG. 1B is fabricated in accordance with a third process embodiment that uses a "face" seal, and is described below with reference to FIGS. 14-19.

Figure 2:
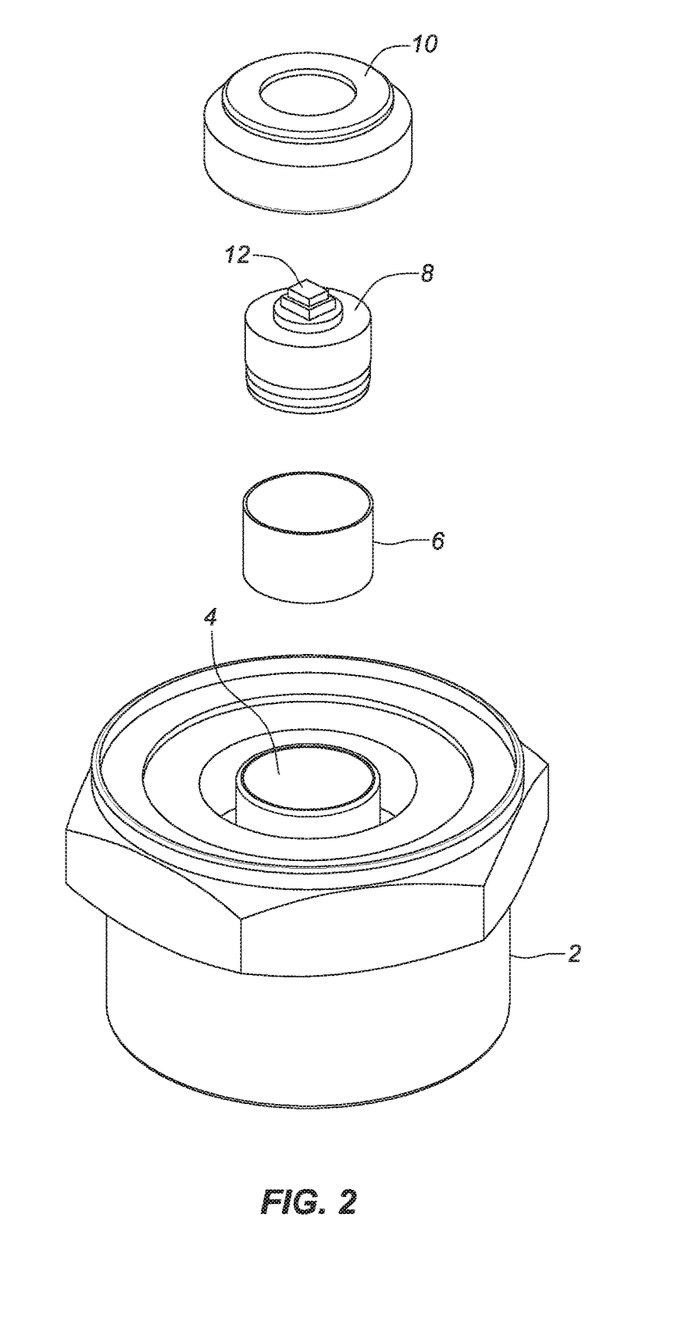
FIG. 2 is a perspective, exploded view of parts used to fabricate one of more first apparatus embodiments having a hermetic seal in accordance with a first process embodiment, i.e., using a radial seal.

FIG. 2 is a perspective, exploded view of parts used to fabricate one or more first embodiments of a pressure sensor apparatus having a hermetic seal in accordance with the first process embodiment, i.e., using a radial seal. As shown in FIG. 2, cavity 4 is formed in housing 2 (for example and without limitation, a metal housing) of the apparatus. In accordance with this first apparatus embodiment, and as further shown in FIG. 2, the first apparatus embodiment is fabricated using radial seal 6 (formed, for example and without limitation, of a soft metal such as copper), stress isolator 8, and collar 10 (formed, for example and without limitation, of high strength steel). As further shown in FIG. 2, MEMS sensor 12 is attached to stress isolator 8.

Figure 3A:
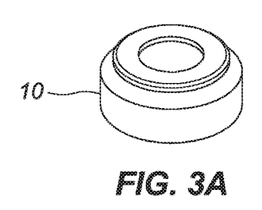
FIG. 3A is a perspective view of a collar used to fabricate one or more embodiments.
Figure 3B:
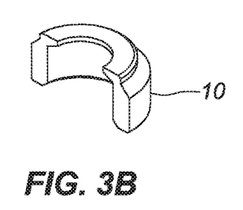
FIG. 3B is a cross sectional view of the collar shown in FIG. 3A.
Figure 4A:
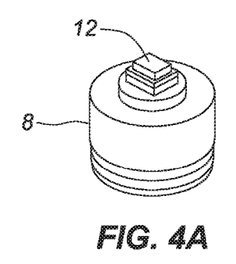
FIG. 4A is a perspective view of a stress isolator with an attached MEMS sensor that is used to fabricate one or more embodiments.
Figure 4B:
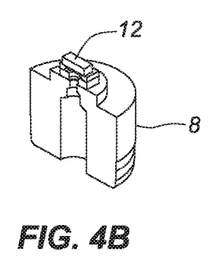
FIG. 4B is a cross sectional view of the stress isolator with an attached MEMS sensor shown in FIG. 4A.
Figure 5A:
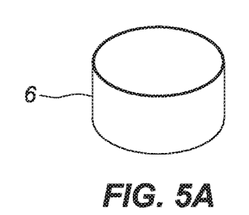
FIG. 5A is a perspective view of a radial seal that is used to fabricate one or more first apparatus embodiments having a hermetic seal in accordance with the first process embodiment.
Figure 5B:
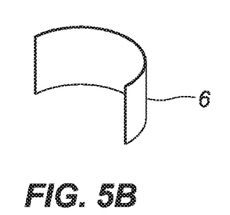
FIG. 5B is a cross sectional view of the radial seal shown in FIG. 5A.
Figure 6A:
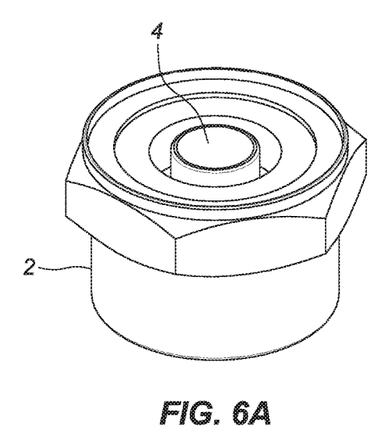
FIG. 6A is a perspective view of a housing that used to fabricate one or more first apparatus embodiments having a hermetic seal in accordance with the first process embodiment.
Figure 6B:
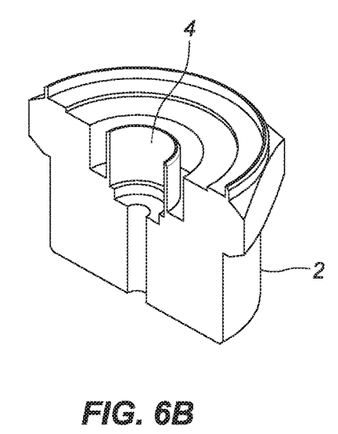
FIG. 6B is a cross sectional view of the housing shown in FIG. 6A.

FIG. 3A is a perspective view of collar 10, and FIG. 3B is a cross sectional view of collar 10; FIG. 4A is a perspective view of stress isolator 8 with attached MEMS sensor 12, and FIG. 4B is a cross sectional view of stress isolator 8 with attached MEMS sensor 12; FIG. 5A is a perspective view of radial seal 6, and FIG. 5B is a cross sectional view of radial seal 6; and FIG. 6A is a perspective view of housing 2 having cavity 4 disposed therewithin, and FIG. 6B is a cross sectional view of housing 2 having cavity 4 disposed therewithin.

In accordance with one or more such first apparatus embodiments, housing 2 can be made of a metal, such as, for example and without limitation, stainless steel, brass, and aluminum or it may be fabricated as a plastic molded part having a metal insert. In addition, housing 2 can be made of other materials or metal composites so long as they are capable of withstanding the stress and strain of the fabrication process described herein, and they have material characteristics suitable to maintaining the hermetic seal. In further addition, housing 2 includes cavity 4. In accordance with one or more such embodiments, the walls of cavity 4 may have any shape that is suitable to accept radial seal 6 snugly therein (as used herein, the term snugly refers to a tight fit, but not so tight as requiring a press fit). Note that for this embodiment, an aperture in housing 2 that extends to the bottom of cavity 4 (refer to FIG. 6B) does not extend up into, and between the walls of, cavity 4.

In accordance with one or more embodiments, stress isolator 8 is made of a metal having a low coefficient of thermal expansion, and stress isolator has a diameter that is smaller than the diameter of cavity 4. In accordance with one or more such embodiments, a suitable metal having a suitably low coefficient of thermal expansion can be, for example and without limitation, an iron base alloy such as, for example and without limitation, Invar or a Kovar alloy containing, by weight, 42% nickel and the balance iron.

In accordance with one or more embodiments, collar 10 can be made from high strength stainless steel such as, for example and without limitation, alloys and machine-able stainless steels like SUS300 series, SUS400 series, and SUS600 series stainless steels. In accordance with one or more embodiments, collar 10 has walls that fit snugly around the outer walls of cavity 4.

In accordance with one or more such first apparatus embodiments, radial seal 6 (illustrated in FIGS. 5A and 5B) can be made from a metal such as, for example and without limitation, soft copper—where the term soft copper generally means about 100% copper and little or no other alloy. In addition, radial seal 6 can be made from other materials such as, for example and without limitation, Teflon, aluminum, and any other soft metal materials such as soft copper alloys. When the apparatus is assembled in accordance with one or more first process embodiments, radial seal 6 surrounds, or encapsulates stress isolator 8, in a radial manner. In accordance with one or more embodiments, the diameter of radial seal 6 is smaller than the diameter of cavity 4, but is larger than the diameter of stress isolator 8 to create a snug fit between the two. In accordance with one or more embodiments, although radial seal 6 is shown as having a cylindrical shape, radial seal 6 is not limited to this shape. In accordance with one or more embodiments, the walls of radial seal 6 do not extend to the top of the walls of cavity 4.

Although FIG. 4A shows MEMS sensor 12 attached to the top of stress isolator 8, further embodiments exist where MEMS sensor is placed at locations on stress isolator 8 other that at the top thereof. In accordance with one or more embodiments, MEMS sensor 12 can be any conventional MEMS sensor currently available. In addition, in accordance with one or more embodiments, stress isolator 8 can be shaped in any manner so long as it can be surrounded by radial seal 6.

Figure 7:
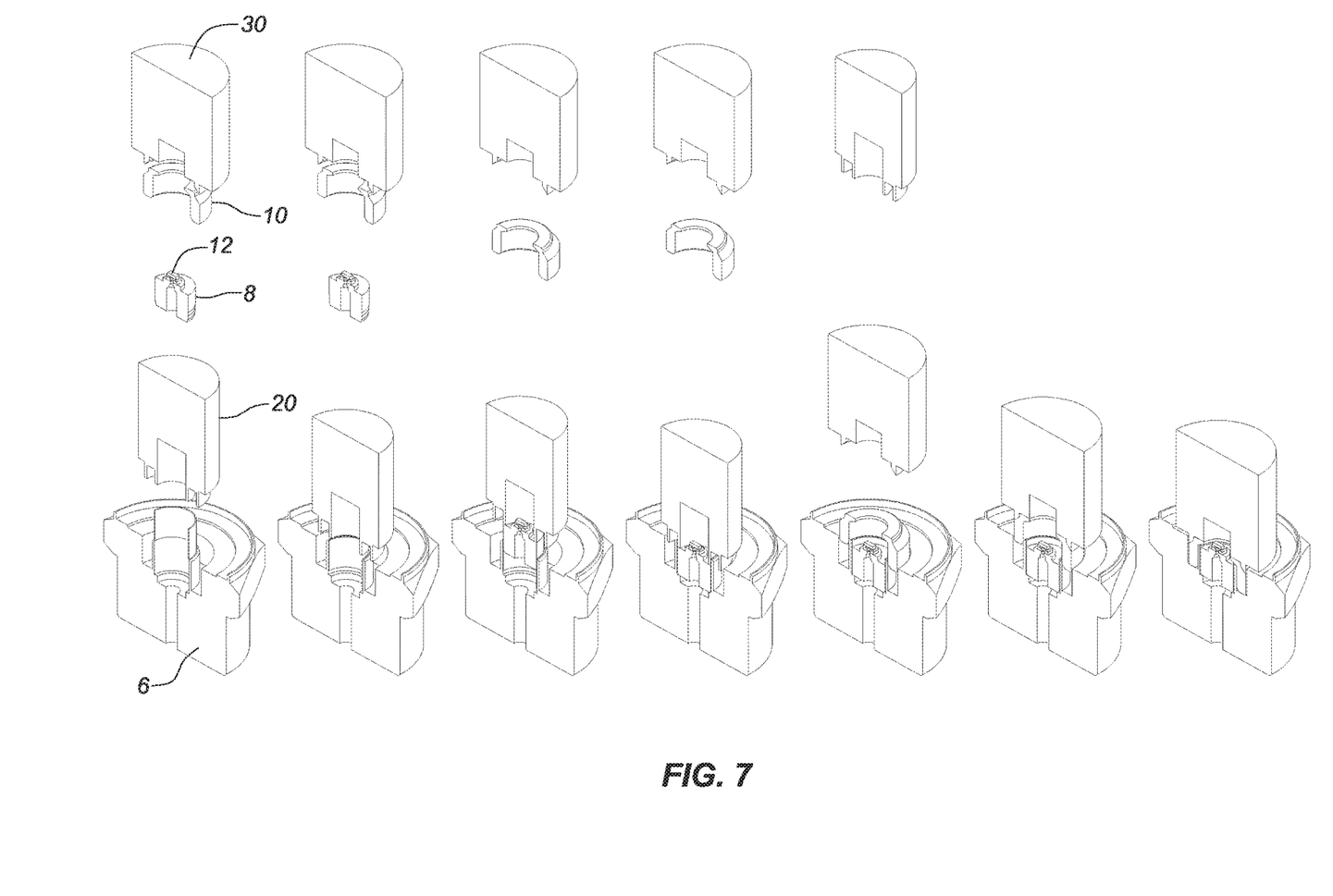
FIG. 7 is an illustration of steps of a radial seal crimping process that are carried out in accordance with one or more first process embodiments to fabricate one or more first apparatus embodiments.

FIG. 7 is an illustration of steps (of a radial seal crimping process) that are carried out in accordance with one or more first process embodiments to fabricate one or more first apparatus embodiments. First, first crimper 20 is used to place radial seal 6 within cavity 4 of housing 2. Next, first crimper 20 is used to place stress isolator 8 with attached MEMS sensor 12 within radial seal 6 in cavity 4. Next, first crimper 20 is used to exert pressure on top of stress isolator 8 (for example and without limitation, a pressure of about 0.5 ton psi) to press stress isolator 8 and attached MEMS sensor 12 down completely inside radial seal 6. Next, second crimper 30 is used to place collar 10 above stress isolator 8 so that its walls extend around the outer wall of cavity 4. Next, second crimper 30 is used to exert pressure on top of collar 10 (for example and without limitation, a pressure of about 2 tons psi) so that the walls of cavity 4 are crimped down (also referred to as compressed down) on radial seal 6 and stress isolator 8. In response, radial seal 6 is deformed and it fills gaps (it is believed to have "melted") between the outside of stress isolator 8 and the inner walls of cavity 4, and the walls of cavity 4 are crimped down on stress isolator 8 to provide a retaining force therefor within housing 2—this retaining force prevents stress isolator 8 from being evicted from cavity 4 under applied pressure of gas or liquid. As a result, radial seal 6 has been deformed to provide a hermetic and airtight seal in cavity 4 of housing 2 between the outer wall of stress isolator 8, radial seal 6, and the inner wall of cavity 4. In other words, a metal seal is compressed in a cavity bounded by cavity walls that is formed in a housing, which housing also includes a sensor attached to a stress isolator (also referred to as an stress isolator pedestal), i.e., an external crimper is press fitted outside the cavity walls, and as a result, the cavity walls are bent down on the stress isolator pedestal and, a retaining force is exerted on the stress isolator pedestal.

Figure 8:
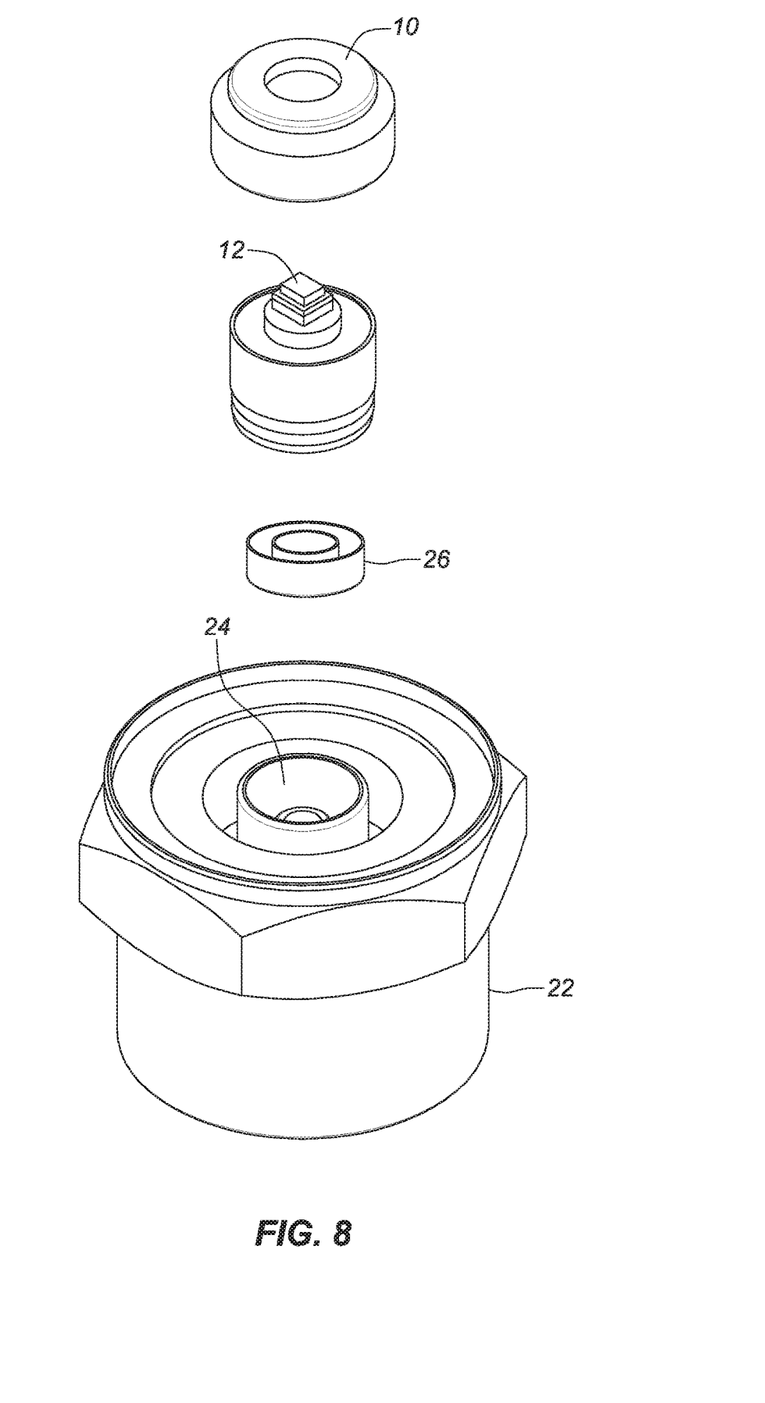
FIG. 8 is a perspective, exploded view of parts used to fabricate one or more second apparatus embodiments having a hermetic seal in accordance with a second process embodiment, i.e., using a "complete" seal.

FIG. 8 is a perspective, exploded view of parts used to fabricate one or more second embodiments of a pressure sensor apparatus having a hermetic seal in accordance with the second process embodiment, i.e., using a "complete" seal. As shown in FIG. 8, the apparatus that is fabricated in accordance with the second process embodiment is similar to the apparatus described above that is fabricated in accordance with the first process embodiment, except that the housings and the seals are different from each other. In addition, as will be described further below, the crimping processes used to fabricate the respective hermetic seals are different.

As shown in FIG. 8, cavity 24 is formed in housing 22 (for example and without limitation, a metal housing) of the apparatus. In accordance with this second apparatus embodiment, and as further shown in FIG. 8, the second apparatus embodiment is fabricated using "complete" seal 26 (formed, for example and without limitation, of a soft metal such as copper), stress isolator 8, and collar 10 (formed, for example and without limitation, of high strength steel). As further shown in FIG. 8, MEMS sensor 12 is attached to stress isolator 8 as was described above with respect to the first apparatus embodiment.

Figure 9A:
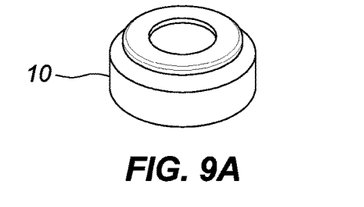
FIG. 9A is a perspective view of a collar used to fabricate one or more embodiments.
Figure 9B:
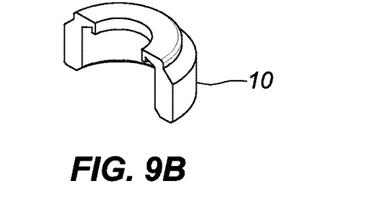
FIG. 9B is a cross sectional view of the collar shown in FIG. 9A.
Figure 10A:
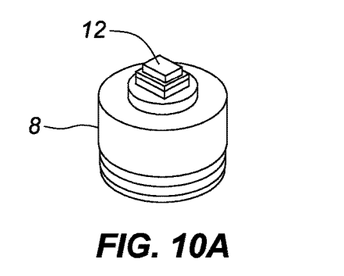
FIG. 10A is a perspective view of a stress isolator with an attached MEMS sensor that is used to fabricate one or more embodiments.
Figure 10B:
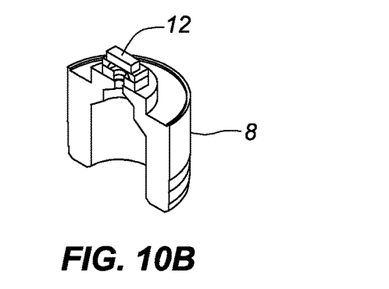
FIG. 10B is a cross sectional view of the stress isolator with an attached MEMS sensor shown in FIG. 10A.
Figure 11A:
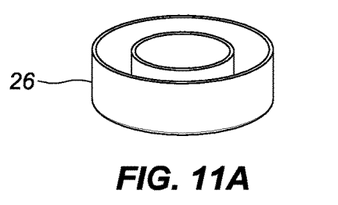
FIG. 11A is a perspective view of a "complete" seal that is used to fabricate one or more second apparatus embodiments having a hermetic seal in accordance with the second embodiment.
Figure 11B:
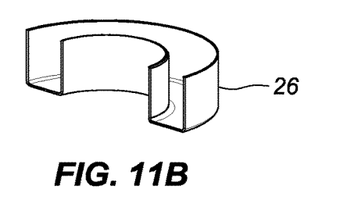
FIG. 11B is a cross sectional view of the "complete" seal shown in FIG. 11A.
Figure 12A:
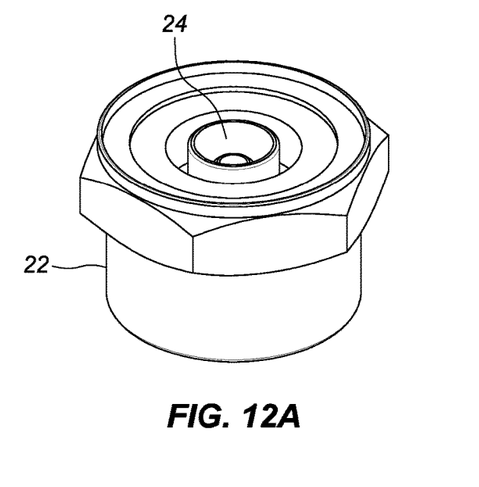
FIG. 12A is a perspective view of a housing that is used to fabricate one or more second apparatus embodiments having a hermetic seal in accordance with the second embodiment.
Figure 12B:
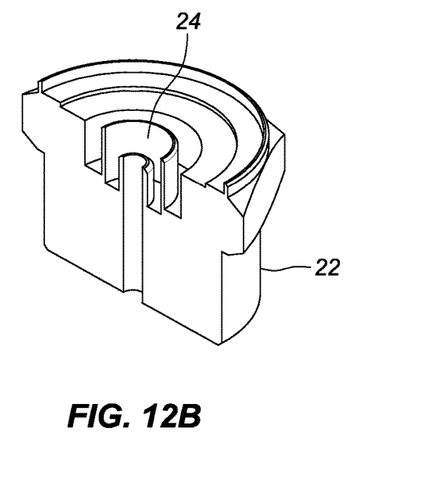
FIG. 12B is a cross sectional view of the housing shown in FIG. 12A.

FIG. 9A is a perspective view of collar 10, and FIG. 9B is a cross sectional view of collar 10; FIG. 10A is a perspective view of stress isolator 8 with attached MEMS sensor 12, and FIG. 10B is a cross sectional view of stress isolator 8 with attached MEMS sensor 12; FIG. 11A is a perspective view of "complete" seal 26, and FIG. 11B is a cross sectional view of "complete" seal 26; and FIG. 12A is a perspective view of housing 22 having cavity 24 disposed therewithin, and FIG. 12B is a cross sectional view of housing 22 having cavity 24 disposed therewithin.

The materials of which collar 10 and stress isolator 8 with attached MEMS sensor 12 are fabricated have been described above.

In accordance with one or more such second apparatus embodiments, housing 22 can be made of metal, such as, for example and without limitation, stainless steel, brass, and aluminum or it may be fabricated as a plastic molded part having a metal insert. In addition, housing 22 can be made of other materials or metal composites so long as they are capable of withstanding the stress and strain of the fabrication process described herein, and they have material characteristics suitable to maintaining the hermetic seal. In further addition, housing 22 includes cavity 24. In accordance with one or more such embodiments, cavity 24 may have any shape that is suitable to accept "complete" seal 26 snugly therein. Note that for this embodiment, duct (or pipe) in housing 22 that extends into cavity 24 (refer to FIG. 12B).

In accordance with one or more such second apparatus embodiments, "complete" seal 26 (illustrated in FIGS. 11A and 11B) can be made from a metal such as, for example and without limitation, soft copper. In addition, "complete" seal 26 can be made from other materials such as, for example and without limitation, Teflon, aluminum, and other soft metal materials such as soft copper alloys. During apparatus assembly in accordance with one or more second process embodiments, stress isolator 8 sits snugly in, and on top of, "complete" seal 26 once they are placed within cavity 24 of housing 22. In accordance with one or more embodiments, "complete" seal 26 is shown as having a toroidal shape with an open top. However, "complete" seal 26 is not limited to this particular shape, and further embodiments exist where "complete" seal 26 may have any suitable shape so long as stress isolator 8 can fit in "complete" seal 26. In accordance with one or more embodiments, the walls of "complete" seal 26 do not extend to the top of the walls of cavity 24.

Figure 13:
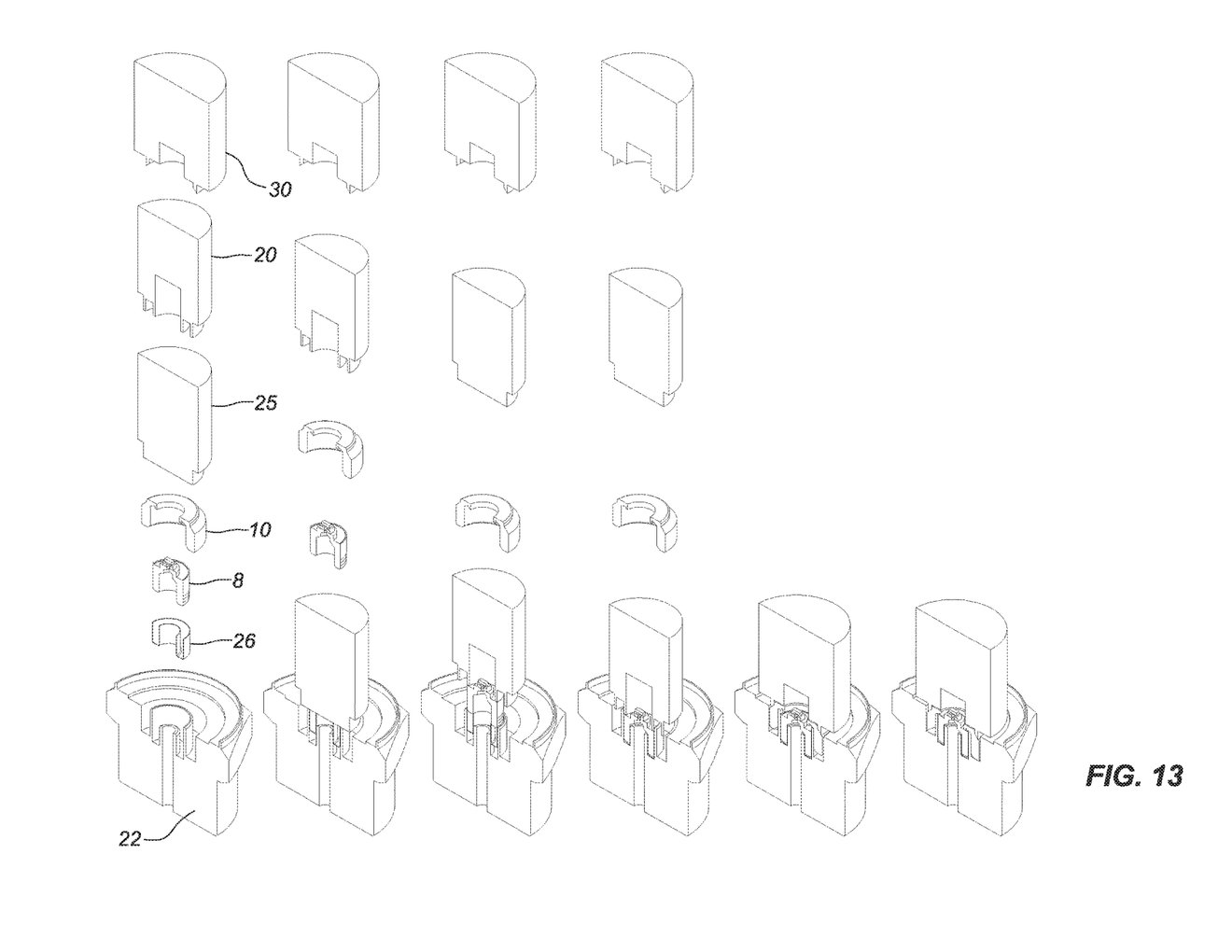
FIG. 13 is an illustration of steps of a "complete" seal crimping process that are carried out in accordance with one or more second process embodiments to fabricate one or more second apparatus embodiments.

FIG. 13 is an illustration of steps (of a "complete" seal crimping process) that are carried out in accordance with one or more second process embodiments to fabricate one or more second apparatus embodiments. First, third crimper 25 is used to place "complete" seal 26 within cavity 24 of housing 22. Next, first crimper 20 is used to place stress isolator 8 with attached MEMS sensor 12 in "complete" seal 26 in cavity 24. Next, first crimper 20 is used to exert pressure on top of stress isolator 8 (for example and without limitation, a pressure of about 0.5 ton psi) to press stress isolator 8 and attached MEMS sensor 12 completely in between the walls or edges of "complete" seal 26. Next, second crimper 30 is used to place collar 10 above stress isolator 8 so that its walls extend around the outer wall of cavity 24. Next, second crimper 30 is used to exert pressure on top of collar 10 (for example and without limitation, a pressure of about 2 tons psi) so that the walls of cavity 24 are crimped down on "complete" seal 26 and stress isolator 8. In response, "complete" seal 26 is deformed and it fills gaps (it is believed to have "melted") between the outside of stress isolator 8 and the inner walls of cavity 24, and the walls of cavity 24 are crimped down on stress isolator 8 to provide a retaining force therefor within housing 22. As a result, "complete" seal 26 has been deformed to provide a hermetic and airtight seal in cavity 24 of housing 22 between the outer wall of stress isolator 8, "complete" seal 26, and the inner wall of cavity 24.

Figure 14:
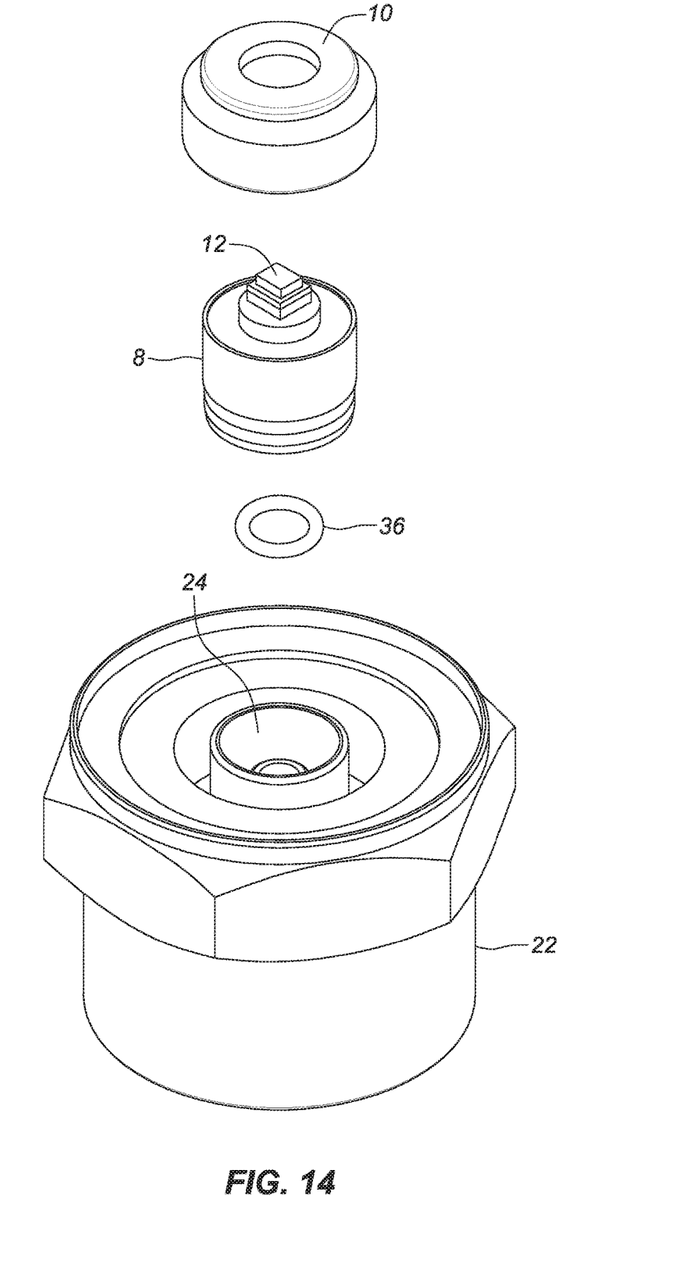
FIG. 14 is a perspective, exploded view of parts used to fabricate one or more third apparatus embodiments having a hermetic seal in accordance with a third process embodiment, i.e., using a "face" seal.

FIG. 14 is a perspective, exploded view of parts used to fabricate one or more third embodiments of a pressure sensor apparatus having a hermetic seal in accordance with the third process embodiment, i.e., using a "face" seal. As shown in FIG. 14, the apparatus that is fabricated in accordance with the third process embodiment is similar to the apparatus described above that is fabricated in accordance with the second process embodiment, except that the seals are different from each other. In addition, as will be described further below, the crimping processes used to fabricate the respective hermetic seals are different.

As shown in FIG. 14, cavity 24 is formed in housing 22. In accordance with this third apparatus embodiment, and as further shown in FIG. 14, the third apparatus embodiment is fabricated using "face" seal 36 (formed, for example and without limitation, of a soft metal such as copper), stress isolator 8, and collar 10 (formed, for example and without limitation, of high strength steel). As further shown in FIG. 14, MEMS sensor 12 is attached to stress isolator 8 as was described above with respect to the first apparatus embodiment.

Figure 15A:
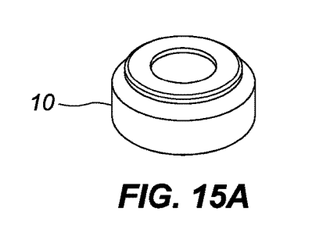
FIG. 15A is a perspective view of a collar used to fabricate one or more embodiments.
Figure 15B:
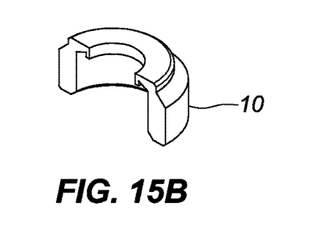
FIG. 15B is a cross sectional view of the collar shown in FIG. 15A.
Figure 16A:
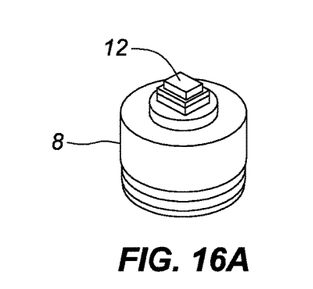
FIG. 16A is a perspective view of a stress isolator with an attached MEMS sensor that is used to fabricate one or more embodiments.
Figure 16B:
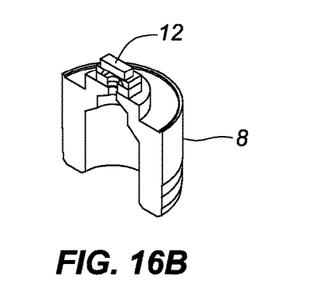
FIG. 16B is a cross sectional view of the stress isolator with an attached MEMS sensor shown in FIG. 16A.
Figure 17A:
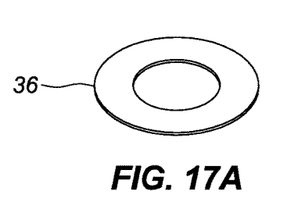
FIG. 17A is a perspective view of a "face" seal that is used to fabricate one or more first apparatus embodiments having a hermetic seal in accordance with the third process embodiment.
Figure 17B:
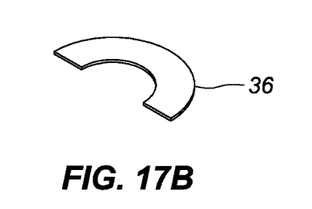
FIG. 17B is a cross sectional view of the "face" seal shown in FIG. 17A.
Figure 18A:
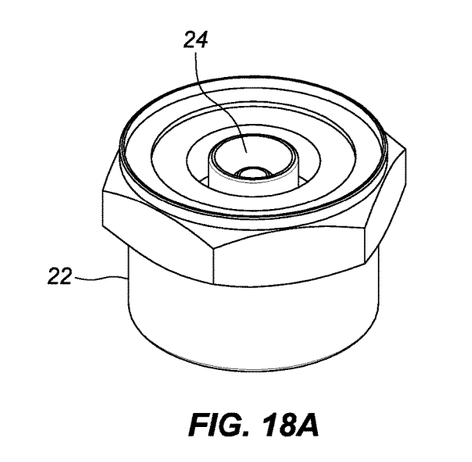
FIG. 18A is a perspective view of a housing that is used to fabricate one or more second apparatus embodiments having a hermetic seal in accordance with the second and the third process embodiments.
Figure 18B:
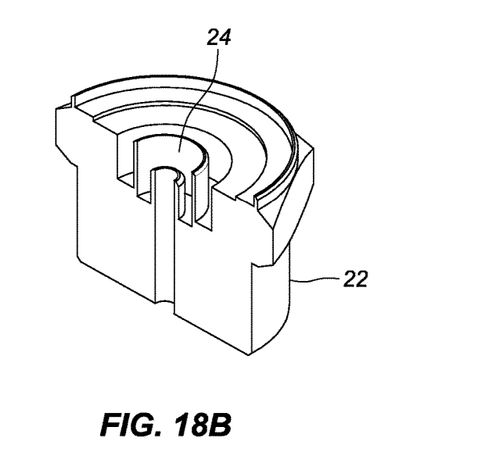
FIG. 18B is a cross sectional view of the housing shown in FIG. 18A.

FIG. 15A is a perspective view of collar 10, and FIG. 15B is a cross sectional view of collar 10; FIG. 16A is a perspective view of stress isolator 8 with attached MEMS sensor 12, and FIG. 16B is a cross sectional view of stress isolator 8 with attached MEMS sensor 12; FIG. 17A is a perspective view of "face" seal 26, and FIG. 17B is a cross sectional view of "face" seal 36; and FIG. 18A is a perspective view of housing 22 having cavity 24 disposed therewithin, and FIG. 18B is a cross sectional view of housing 22 having cavity 24 disposed therewithin.

The materials of which collar 10 and stress isolator 8 with attached MEMS sensor 12 are fabricated have been described above. In addition, the materials of which housing 22 is fabricated have been described above. In accordance with one or more embodiments, cavity 24 may have any shape that is suitable to accept "face" seal snugly therein.

In accordance with one or more such third apparatus embodiments, "face" seal 36 (illustrated in FIGS. 17A and 17B) can be made from a metal such as, for example and without limitation, soft copper. In addition, "face" seal 36 can be made from other materials such as, for example and without limitation, Teflon, aluminum, and any other soft metal materials. During apparatus assembly in accordance with one or more third process embodiments, stress isolator 8 sits snugly in cavity 24 on top of "face" seal 36 once they are placed in the cavity 24 of the housing 22. In accordance with one or more embodiments, "face" seal 36 is shown to be shaped as a disk. However, "face" seal 36 is not limited to this particular shape, and further embodiments exist where "face" seal may have any suitable shape so long as "face" seal 36 can sit snugly within the walls of cavity 24.

Figure 19:
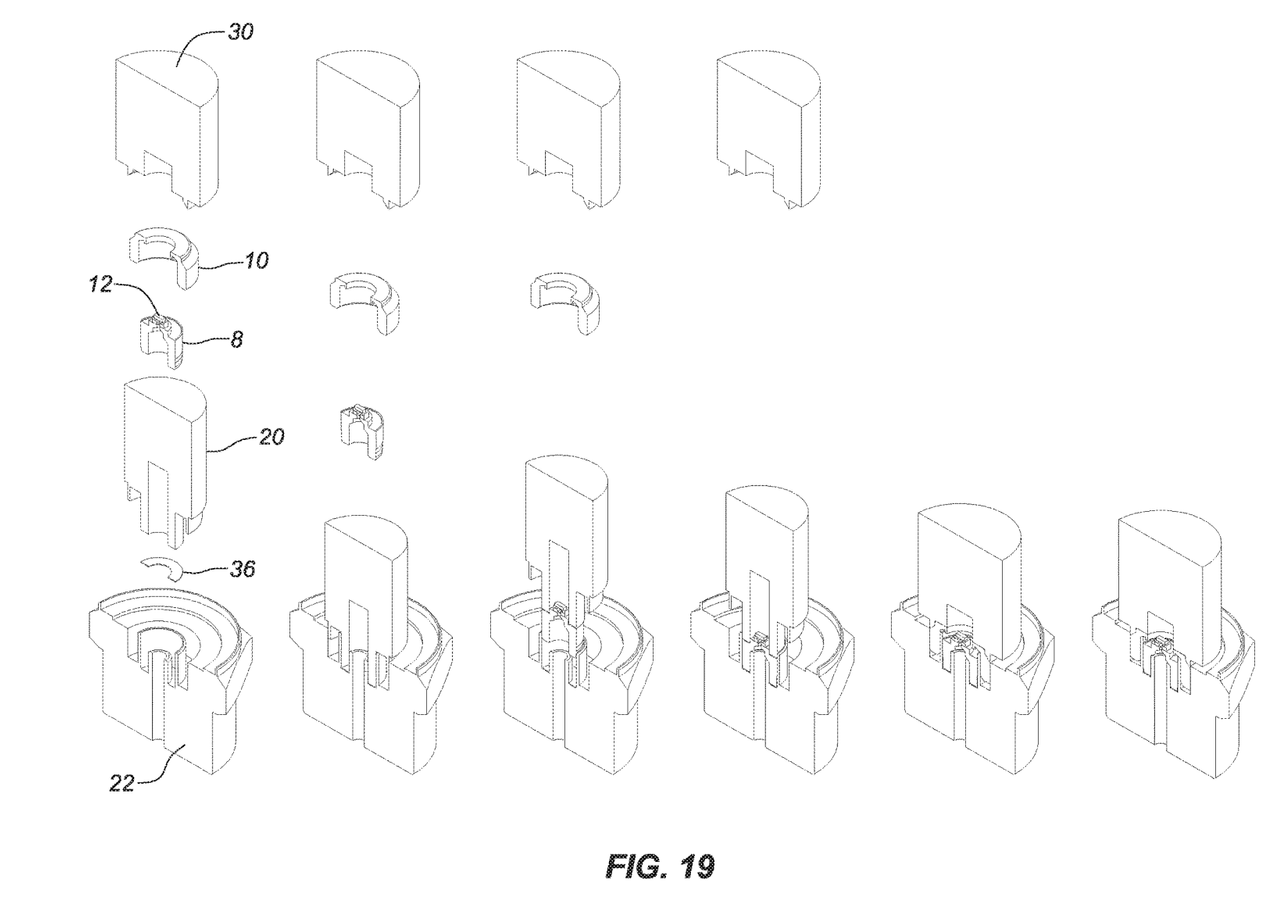
FIG. 19 is an illustration of steps of a "face" seal crimping process that are carried out in accordance with one or more third embodiments to fabricate one or more third apparatus embodiments.

FIG. 19 is an illustration of steps (of a "face" seal crimping process) that are carried out in accordance with one or more third process embodiments to fabricate one or more third apparatus embodiments. First, first crimper 20 is used to place "face" seal 36 within cavity 24 of the housing 22. Next, first crimper 20 is used to place stress isolator 8 with attached MEMS sensor 12 in cavity 24. Next, first crimper 20 is used to exert pressure on top of stress isolator 8 (for example and without limitation, a pressure of about 0.5 ton psi) to press stress isolator 8 and attached MEMS sensor 12 down completely on "face" seal 36. Next, second crimper 30 is used to place collar 10 above stress isolator 8 so that its walls extend around the outer wall of cavity 24. Next, second crimper 30 is used to exert pressure on collar 10 (for example and without limitation, a pressure of about 2 tons psi) so that the walls of cavity 24 are crimped down on "face" seal 36 and stress isolator 8. In response, "face" seal is deformed and it fills gaps (it is believed to have "melted") between a bottom surface of stress isolator 8 and surfaces of the inner walls of cavity 24, and the walls of cavity 24 are crimped down on stress isolator 8 to provide a retaining force therefor within housing 22. As a result, "face" seal 36 has been deformed to provide a hermetic and airtight seal in cavity 24 of housing 22 between the bottom surface of stress isolator 8, "face" seal 36, and the inner wall of cavity 24.

Embodiments described above are exemplary. For example, numerous specific details are set forth such as parts, dimensions, temperature ranges, materials, mechanical design, etc. to provide a thorough understanding of the present invention. However, as one having ordinary skill in the art would recognize, the present invention can be practiced without resorting to the details specifically set forth. As such, many changes and modifications may be made to the description set forth above by those of ordinary skill in the art (i.e., various refinements and substitutions of the various embodiments are possible based on the principles and teachings herein) while remaining within the scope of the invention. In addition, materials, methods, and mechanisms suitable for fabricating embodiments have been described above by providing specific, non-limiting examples and/or by relying on the knowledge of one of ordinary skill in the art. Materials, methods, and mechanisms suitable for fabricating various embodiments or portions of various embodiments described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. An apparatus having a hermetic seal comprising:
    a housing with a top and bottom and a first hole that passes through the housing from the top to the bottom wherein the housing further comprises a first cavity with an inner wall, outer wall and first cavity bottom and the first cavity extends down into the housing from the top and surrounds the first hole and wherein the housing further comprises a second cavity that extends down into the housing from the top and surrounds, and is coaxial with, the first cavity;
    a disk shaped metal seal with a second hole through a center of the disk wherein the disk shaped metal seal is located on the first cavity bottom wherein the disk shaped metal seal surrounds and is coaxial with the inner wall;
    an isolation member coupled to a sensor and extending down into the first cavity on top of the disk shaped metal seal between the inner wall and outer wall of the first cavity; and
    a collar pressed down into the housing and into the second cavity wherein the collar has a third hole that passes through the collar and the sensor extends up into the third hole and wherein the collar crimps the outer wall against the isolation member.

2. The apparatus of claim 1, wherein the disk shaped metal seal covers the bottom of the first cavity.

3. The apparatus of claim 1, wherein the housing is cylinder shaped.

4. The apparatus of claim 1, wherein the disk shaped metal seal is made from copper.

5. The apparatus of claim 1, wherein the disk shaped metal seal is a copper alloy.

6. The apparatus of claim 1, wherein the sensor is a MEMS sensor.

7. The apparatus of claim 1, wherein the collar is made from steel.

8. The apparatus of claim 1, wherein the housing comprises of one or more of stainless steel, brass and aluminum.

9. The apparatus of claim 1 wherein the third hole is coaxial with the first hole, first cavity and second cavity.

10. The apparatus of claim 1 wherein the sensor is a pressure sensor.

11. An apparatus having a hermetic seal comprising:
    a housing with a top and bottom and a first hole that passes through the housing from the top to the bottom wherein the housing further comprises a first cavity that extends down into the housing from the top and surrounds the first hole and has a first cavity bottom and wherein the housing further comprises a protrusion that surrounds the first hole and extends up from the first cavity bottom into the first cavity and wherein the housing further comprises a second cavity that extends down into the housing from the top and surrounds, and is coaxial with, the first cavity;
    a disk shaped metal seal with a second hole through a center of the disk wherein the disk shaped metal seal is located on the first cavity bottom wherein the disk shaped metal seal surrounds and is coaxial with the protrusion;
    an isolation member coupled to a sensor and extending down into the first cavity on top of the disk shaped metal seal between the protrusion and an outer wall of the first cavity; and
    a collar pressed down into the housing and into the second cavity wherein the collar has a third hole that passes through the collar and the sensor extends up into the third hole and wherein the collar crimps the outer wall against the isolation member.

12. The apparatus of claim 11, wherein the disk shaped metal seal covers the bottom of the first cavity.

13. The apparatus of claim 11, wherein the housing is cylinder shaped.

14. The apparatus of claim 11, wherein the disk shape metal seal is a copper alloy.

15. The apparatus of claim 11, wherein the sensor is a MEMS sensor.

16. The apparatus of claim 11, wherein the collar is made from steel.

17. The apparatus of claim 11, wherein the housing comprises of one or more of stainless steel, brass and aluminum.

18. The apparatus of claim 11, wherein the third hole is coaxial with the first hole, first cavity and second cavity.

19. The apparatus of claim 11, wherein the sensor is a pressure sensor.

20. The apparatus of claim 11, wherein the disk shaped metal seal is made from copper.

21. An apparatus having a hermetic seal comprising:
    a housing with a top and bottom and a first hole that passes through the housing from the top to the bottom wherein the housing further comprises a first cavity that extends down into the housing from the top and surrounds the first hole and has a first cavity bottom and wherein the housing further comprises a pipe that surrounds the first hole and extends up from the first cavity bottom into the first cavity and wherein the housing further comprises a second cavity that extends down into the housing from the top and surrounds, and is coaxial with, the first cavity;
    a disk shaped metal seal with a second hole through a center of the disk wherein the disk shaped metal seal is located on the first cavity bottom wherein the disk shaped metal seal surrounds and is coaxial with the pipe;
    an isolation member coupled to a sensor and extending down into the first cavity on top of the disk shaped metal seal between the pipe and an outer wall of the first cavity; and
    a collar pressed down into the housing and into the second cavity wherein the collar has a third hole that passes through the collar and the sensor extends up into the third hole and the collar crimps the outer wall against the isolation member.

* * * * *